United States Patent [19]
Mitsui

[11] 3,725,821
[45] Apr. 3, 1973

[54] SEMICONDUCTOR NEGATIVE RESISTANCE DEVICE

[76] Inventor: Shigeru Mitsui, c/o Kitaitami Works of Mitsubishi Denki kabushiki Kaisha, No. 1, Aza Zugaike, Ojika, Itami, Hyogo Prefecture, Japan

[22] Filed: May 17, 1972

[21] Appl. No.: 254,239

Related U.S. Application Data

[63] Continuation-in-part of Ser. No. 879,249, Nov. 24, 1969, abandoned.

[52] U.S. Cl. ........331/107 G, 317/234 V, 317/235 K, 330/5, 331/107 R
[51] Int. Cl. ..........H03b 7/06
[58] Field of Search ..........331/107 R, 107 G, 94; 317/234 V, 235 K; 330/5, 34, 61 A

[56] References Cited

UNITED STATES PATENTS

| | | | |
|---|---|---|---|
| 3,215,862 | 11/1965 | Erlback | 331/107 R |
| 3,458,832 | 7/1969 | McGroddy et al. | 317/234 V |
| 3,480,879 | 11/1969 | Nathan et al. | 331/107 G |
| 3,516,019 | 6/1970 | Kroemer et al. | 330/5 X |

OTHER PUBLICATIONS

Hall et al., IBM Technical Disclosure Bulletin, Vol. 8, September 1965, pp. 651, 652.

*Primary Examiner*—Roy Lake
*Assistant Examiner*—Siegfried H. Grimm
*Attorney*—Robert E. Burns et al.

[57] ABSTRACT

A method of imparting a negative resistance to a wafer of semiconductive material having applied thereacross an electric field of a threshold magnitude above which current flowing through the semiconductive material decreases with an increase in the applied field comprises the steps of causing both electrons and holes to exist respectively in the conduction and valence bands of the semiconductive material so as to be approximately equal in density to each other in thermal equilibrium in the absence of the applied electric field. The semiconductive material has an energy band structure including first and second valleys in the conduction band and a third valley in the valence band. The second valley is higher in energy level than the first valley and a vector of wave number at a minimum point on the second valley is equal to that at a maximum point on the third valley in the valence band.

25 Claims, 9 Drawing Figures

SEMICONDUCTOR NEGATIVE RESISTANCE DEVICE

This is a continuation-in-part of my copending application Ser. No. 879,249, filed Nov. 24, 1969 now abandoned.

This invention relates to semiconductor devices utilizing a bulk negative resistance effect.

A typical bulk negative resistance effect, called the Gunn effect, is that the average drift velocity of carriers in semiconductive materials such as *n*-type gallium arsenide (GaAs) decreases with an increase in an electric field applied across the material.

An object of the invention is to provide a new and improved semiconductor negative resistance device based on fully novel principles. The improved semiconductor device of the invention is useful in circuitry where a negative resistance function is needed.

Another object of the invention is to provide a new and improved semiconductor negative resistance device capable of being prepared from an inexpensive semiconductive material such as germanium or silicon as compared with the semiconductive materials previously used such as gallium arsenide for providing the Gunn effect.

Still another object of the invention is to provide a new and improved semiconductor negative resistance device effectively formed of any one of intrinsic *n*-type and *p*-type semiconductive materials.

An additional object of the invention is to eliminate the difficulty with which an ohmic contact could be previously attached to bodies of intrinsic semiconductive materials.

The invention accomplishes the above cited objects by the provision of a semiconductor negative resistance device comprising a wafer of semiconductive material including a pair of valleys different in energy level from each other in the conduction band, and means for establishing an electric field in the semiconductive material, characterized in that the carriers in the semiconductive material are heated by the electric field to transmit the electrons present in that valley lower in energy level to the other valley higher in energy level and then to transmit the transmitted electrons to the valence band within a period of time shorter than the average transit time of the electrons from the valence band to the lower level valley in the conduction band thereby to decrease the carrier density.

The semiconductive material is of the indirect band type and may be preferably any one selected from the group consisting of germanium (Ge), silicon (Si), gallium phosphide (GaP) and gallium aluminum arsenide [$(Ga_{1-x}\cdot Al_x)As$], where $x$ has a value of about 0.5. As well known in the art, conduction bands, valence bands and valleys are inherent in this type of semiconductive material.

Advantageously, the semiconductor negative resistance device may be formed of a semiconductive material of either *n* or *p*-type conductivity and the semiconductive material may be increased in temperature, irradiated with light and/or have minority carriers electrically injected to render the electron density in the conduction band nearly equal to the hole density in the valence band.

In a preferred embodiment of the invention, the semiconductor negative resistance device may comprise a wafer of semiconductive material including an active region of one conductivity type, a region of opposite conductivity type disposed at one end of the active region to inject the minority carrier, to define a *p-n* junction with the active region, and means for forwardly biasing the *p-n* junction to inject the minority carriers from the injection region into the active region thereby to render the electron density in the conduction band nearly equal to the hole density in the valence band in the active region.

The invention will become readily apparent from the following detailed description taken in conjunction with the accompanying drawings in which.

Figures 2, 4:
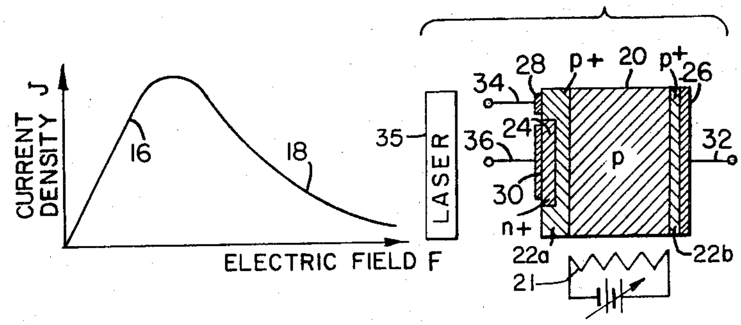
FIG. 2 is a graph illustrating an electric field plotted against current density for the device shown in FIG. 1.
Figure 3A:
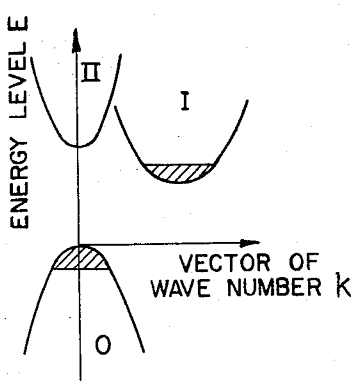
Figure 3B:
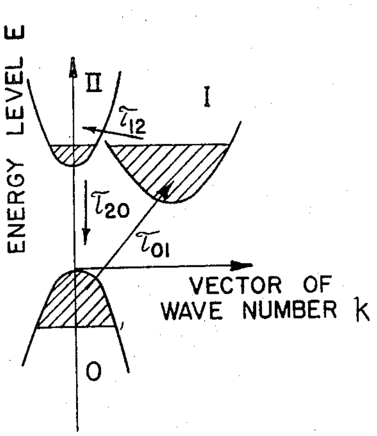
Figure 5:
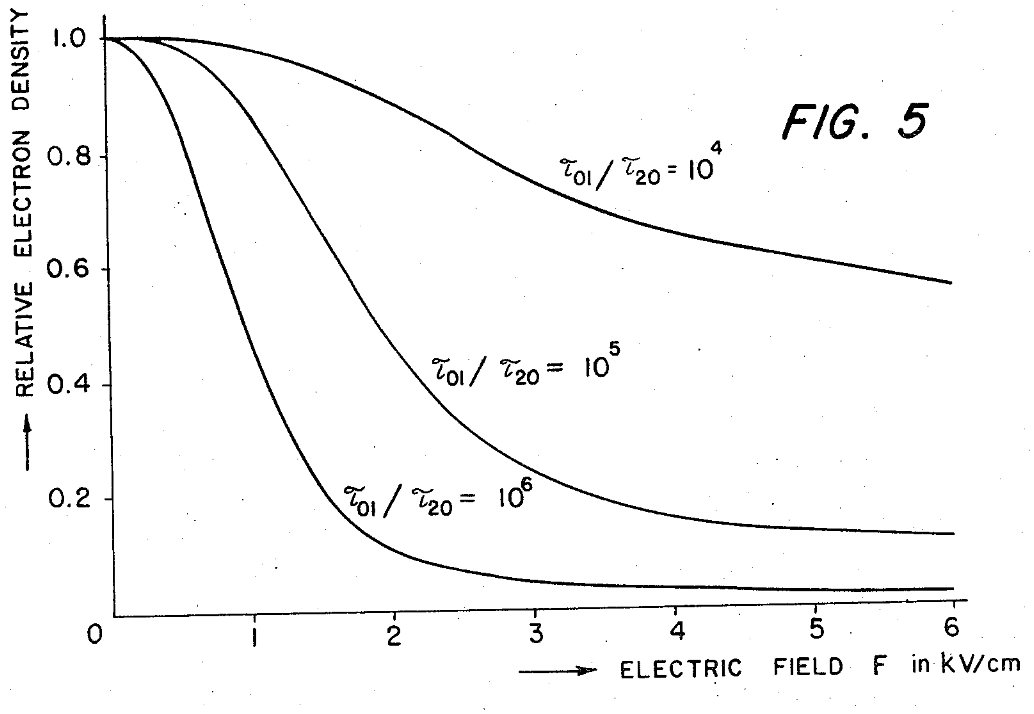
Figure 6:
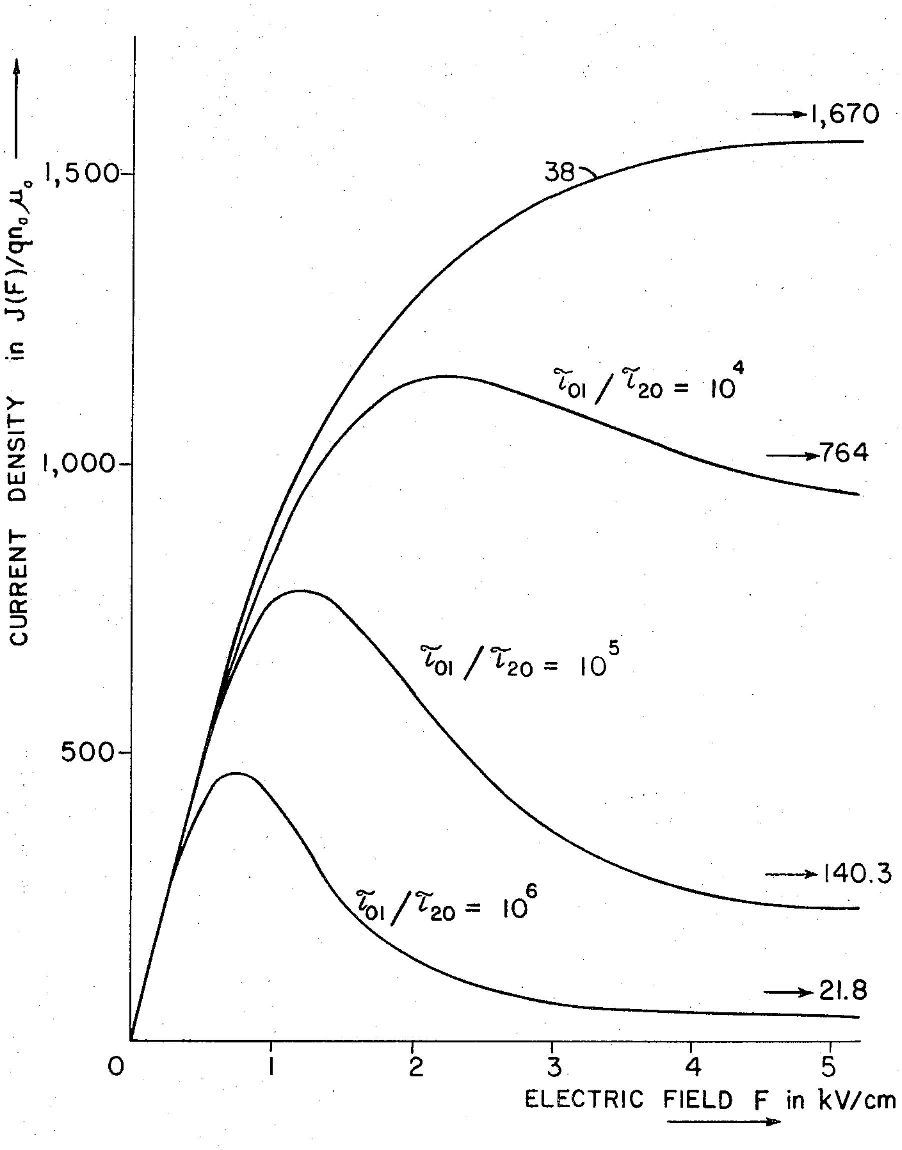
Figure 7:
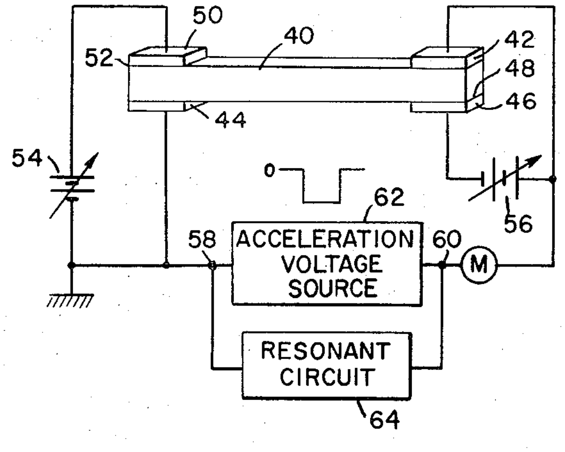
Figure 8:
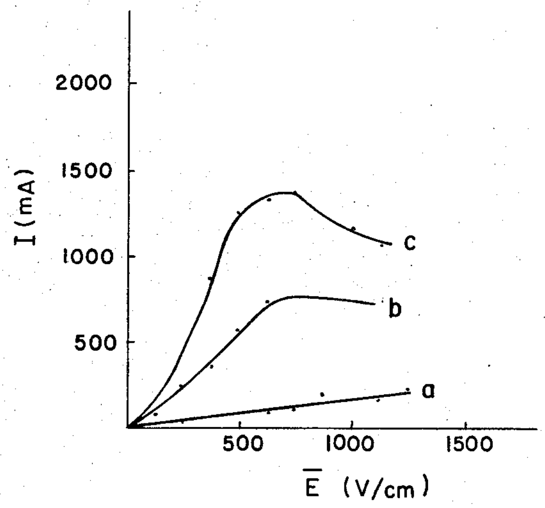

FIGS. 3*a* and 3*b* are schematic views of the structure of the energy bands useful in explaining the principles of the invention;

FIG. 4 is a sectional view of a preferred embodiment of the invention;

FIG. 5 is a graphic representation of the field dependency of the electron density;

FIG. 6 is a graphic representation of the field dependency of the current density;

FIG. 7 is a wiring diagram of a circuit for measuring a negative resistance of a semiconductor bulk; and FIG. 8 is a graph illustrating the results of measurement conducted with the circuit shown in FIG. 7.

The invention is based on the discovery that for certain semiconductive materials the number of the carriers decreases in a high electric field provided that the electrons are substantially equal in number to the holes.

Figure 1:
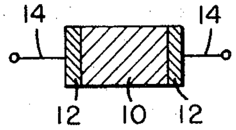
FIG. 1 is a schematic sectional view illustrating the fundamental structure of a semiconductor negative resistance device constructed in accordance with the principles of the invention.

Referring now to the drawings and FIG. 1 in particular, there is illustrated a semiconductor negative resistance device constructed in accordance with the principles of the invention. The arrangement illustrated comprises a wafer 10 of any suitable semiconductor material such as intrinsic germanium, and a metallic electrode 12 formed, for example, of tin (Sn) and disposed in ohmic contact with each of the main opposite faces of the wafer 10. A pair of electric leads 14 are connected to the opposite electrodes 12 respectively. It is now assumed that the electrons are substantially equal in number to the holes in the semiconductive material with no voltage applied across the leads 14.

When a D C voltage is applied across the leads 14 and gradually increased, the density of current flowing through the wafer 10 at first increases to a maximum magnitude and then gradually decreases as shown in FIG. 2 wherein the axis of ordinates represents the current density J and the axis of abscissas represents the electric field F.

The principles and mechanism of the invention will now be described in conjunction with FIGS. 3*a* and 3*b* wherein the axis of ordinates represents the energy level E and the axis of abscissas represents a vector of wave number *k*. FIGS. 3*a* and 3*b* show the structure of energy bands in a semiconductive material of the indirect band type such as, for example, germanium. As shown in FIG. 3*a*, the conduction band includes a pair of valleys labelled "I" and "II" in the $k$ space and the valence band includes a valley labelled "O." The valley I has a minimum energy point at its bottom lower in level than the valley II while the minimum energy point in the conduction valley I is different in the vector of wave number $k$ from a minimum energy point in the valence valley O. However, the vector of wave number $k$ for the maximum energy point on the valence valley O is identical to that for the minimum energy point on the conduction band. For example, $k_1 = (111)$ and $k_2 = k_0 = (000)$ for germanium where the suffixes 1, 2 and O correspond to the valleys I, II and O respectively.

In FIG. 3*b* the electrons travel from the valley O to the valley I, from the valley I to the valley II, and from the valley II to the valley O within the average transit times of $\tau_{01}$, $\tau_{12}$ AND $\tau_{20}$ respectively, as shown by the arrows. For semiconductive materials having the band structure such as shown in FIG. 3, the transit time $\tau_{01}$ between the valleys O and I is generally much longer than the transit time $\tau_{20}$ between the valleys II and O. The transit time $\tau_{12}$ between the valleys I and II is of the order of the collision time far shorter than the transit time $\tau_{20}$ between the valleys II and O. That is, the following relationship is held:

$$\tau_{01} >> \tau_{20} >> \tau_{12} \qquad (1)$$

For example, $\tau_{01}$, $\tau_{12}$ and $\tau_{20}$ are of the order of $10^{-3}$, $10^{-12}$ and $10^{-8}$ second respectively.

Referring back to FIG. 1, with a D C voltage applied across the electrodes 12 to establish the corresponding electric field in the intrinsic semiconductor germanium, an increase in electric field causes the electrons in the germanium 10 first located in the valley I at room temperature, as shown by the hatched portion of the valley I in FIG. 3*a*, to be heated. Then the heated electrons are distributed at higher energy levels in the conduction band until the electrons are also located in the valley II, as shown by the hatched portion of the valley II in FIG. 3*b*. The hatched portion of the valley O indicates the holes located in the valley.

The above mentioned phenomenon will now be mathematically described. When the germanium is initially in the low electric field, the so-called Ohm's law is held:

$$J = \sigma F \qquad (2)$$

where $J$ = current density $F$ = strength of electric field $\sigma$ = electric conductivity The electric conductivity $\sigma$ is expressed by the following equation:

$$\sigma = \mu_1 n_0 + \mu_0 p_0 \qquad (3)$$
$$= (\mu_1 + \mu_0) n_i$$

where $\mu_1$ = drift velocity of electrons in valley I
$\mu_0$ = drift velocity of holes in valley O
$n_0$ = electron density
$p_0$ = hole density
$n_i$ = intrinsic carrier density.

When a flow of electrons follows Ohm's law, as above described, the resulting current density is a function of the applied electric field as shown by a curve portion 16 in FIG. 2.

Then as the electric field increases in strength, the electrons reach higher energy levels until they are also located in the valley II as above described. Under the higher field condition the electron and hole densities reduce in the following process:

(1) The electrons in the valley II recombine with the holes in the valley O at a rate of $1/\tau_{20}$. The rate may be approximately equal, for example to $10^8$ per second.

(2) This recombination of the electrons and the holes causes the electrons in the valley I to transit to the valley II at a rate of $1/\tau_{12}$ which may approximate, for example, $10^{12}$ per second.

(3) Then the electrons are generated in the valley I at a rate of $1/\tau_{01}$. The transition rate $1/\tau_{01}$ from valley O to valley I is approximately, for example, of a magnitude of $10^3$ per second.

The process just described leads to a decrease in the number of electrons in the valley I as well as decreasing the total number of the electrons. The process will now be mathematically described. In the thermal equilibrium that may be considered to nearly correspond to the low field condition, the following equation is held:

$$n_0 = n_{10} + n_{20} = p_0 \qquad (4)$$

where $n_0$, $n_{10}$, $n_{20}$ and $p_0$ represent the electron density in the conduction band, the electron density in the valley I, the electron density in the valley II and the hole density respectively obtained when the germanium is in the thermal equilibrium and in a null field. That is, $n_0$, $n_{10}$, $n_{20}$ and $p_0$ are the initial values of the respective densities.

Once the electrons and holes have been heated by the action of the electric field, the equation (4) changes to the following equation:

$$n = n_1 + n_2 = p \qquad (5)$$

where $n$, $n_1$, $n_2$ and $p$ respectively correspond to $n_0$, $n_{01}$, $n_{02}$ and $p_0$ except that the electrons and holes are in heated state due to the electric field.

The densities appearing in the Equation (5) are functions of the electric field F. Under the heated state, the electrons travel from the valley I to the valley II with the result that the electron density $n_2$ is greater than the initial electron density $n_{20}$ and the electron density $n_1$ is smaller than the initial electron density $n_{10}$ that is $$n_2 > n_{20} \quad \text{and} \quad n_1 < n_{10} \qquad (6)$$

Under these circumstances, the electrons whose number corresponds to a density differential $n_2 - n_{20}$ are transited from the conduction valley II to the valence valley O within the transit time of $\tau_{20}$ to be recombined with the holes in the valley O. Also the depleted electrons whose number corresponds to a density differential $n_{10} - n_1$ travel from the valency valley O to the conduction valley I within the transit time of $\tau_{01}$. In the steady state the number of the electrons transferred from the valley II to the valley O is equal to the number of the electrons transferred from the valley O to the valley I, which results in the following equation: q $$n_2 - n_{20}/\tau_{20} = n_{10} - n_1/\tau_{01} \quad (7)$$

From the Equations (4), (5) and (7) $n$ is expressed by the equation:

$$n = n_0 \frac{\frac{\tau_{01}}{\tau_{20}} + C_0}{1 + C_0} \left\{ 1 - \frac{\frac{\tau_{01}}{\tau_{20}} - 1}{\frac{\tau_{01}}{\tau_{20}} + C(F)} \right\} \quad (8)$$

where $C_0$ and $C(F)$ are determined as follows:

$$C_0 = n_{10}/n_{20} \text{ and } C(F) = n_1/n_2 \quad (9)$$

Since $\tau_{01} >> \tau_{20}$ and $C_0 >> 1$ are generally held, the Equation (8) can be approximately expressed by the equation:

$$n \simeq n_0 \left\{ 1 + \frac{\tau_{01}}{\tau_{20}} \cdot \frac{1}{C_0} \right\} \left\{ 1 - \frac{1}{1 + \frac{\tau_{20}}{\tau_{01}} C(F)} \right\} \quad (10)$$

$C(F)$ is far greater than unity with a low electric field but it rapidly decreases as the field increases. In the latter case, $n$ decreases in accordance with the Equation (10). It is noted that $n$ very rapidly decreases provided that the electric field exceeds its predetermined magnitude, that is, with $(\tau_{20}/\tau_{01})\, C(F) \lesssim 1$.

In this connection, it is generally known that the carriers in a high electric field region have a drift velocity reaching saturated magnitude.

From the foregoing it will be appreciated that in the high field region a decrease in the number of the carriers causes the current density to decrease, as shown by curve portion 18 in FIG. 2. That is, a negative resistance effect is exhibited.

While the invention has been described in conjunction with semiconductive germanium, it is to be understood that it is not restricted to its application to the germanium. It has been found that the invention is equally applicable to silicon (Si), gallium phosphide (GaP) gallium aluminum arsenide [$(Ga_{1-x}\cdot Al_x)As$] where $x$ has a value of about 0.5, etc., having the band structure such as shown in FIG. 3.

Also, while the invention has been described in terms of the intrinsic semiconductor it is to be understood that it is not restricted to its application to such semiconductors. It has been found that any semiconductive material having the band structure such as shown in FIG. 3 always exhibits the effect that the disposal of the material in a high electric field causes the number of the carriers to decrease. Also it has been found that as long as semiconductive material has the ratio of electron density $n_0$ to hole density $p_0$ having a value which satisfies the relationship $$0.5 < n_0/p_0 < 2,$$

it is possible to exhibit a negative resistance effect such as shown in FIG. 2.

Further, it has been found that if any semiconductive material, whether it is of the $n$ or $p$-type conductivity, has the electron density $n_0$ approximately equal to the hole density $p_0$, it is possible to exhibit a negative resistance effect. In order to hold the relationship $n \cong p$, it is generally required to inject carriers into the semiconductor. To this end, the wafer of semiconductive material may preferably increase in temperature. Alternatively it may be irradiate with light. The arrangement of FIG. 1 is particularly suitable for use in injecting the carriers through light irradiation.

FIG. 4 shows a form of the invention including effective means for injecting carriers to render the electron density $n_0$ approximately equal to the hole density $p_0$. The arrangement illustrated comprises a substrate 20 of semiconductive material such as germanium including a $p$-type impurity, for example, boron (B), or indium (In), in a concentration of about $10^{15}$ atoms per cubic centimeter of the material, one $p^+$-type layer **22*a* including the above-mentioned $p$-type impurity in a concentration of about $10^{18}$ atoms per cubic centimeter and formed on each of the opposite faces of the substrate 20 as by the diffusion technique, and an $n^+$-type carrier injection region 24 including an $n$-type impurity such as antimony (Sb), phosphor (P) or arsenic (As) in a concentration of about $10^{19}$ atoms per cubic centimeter and disposed on the central portion of the $p^+$-type layer 22*a*. Then an electrode 26 is disposed in ohmic contact with the entire surface of a second $p^+$-type layer 22*b* having no carrier injection region disposed thereon and a pair of separate electrodes 28 and 30 are disposed in ohmic contact with the layer 22*a* and the injection region 24 respectively. The electrodes may be preferably made of aluminum. Further conductive leads 32, 34 and 36 are attached to the electrodes 26, 28 and 30** respectively.

In operation, a forward voltage is applied across the electrodes 28 and 30. That is, the electrode 28 is rendered positive with respect to the electrode 30. This causes the minority carriers, in this case the electrons, to be injected from the injection region 24 into the substrate or active region 20 such that the minority carriers travel from the region **22*a* toward the electrode 26 by the action of a bias applied across the electrodes 26 and 28. This insures that the electron density $n_0$ is approximately equal to the hole density $p_0$ in the active region 20** as above described.

While the arrangement of FIG. 4 has been described in conjunction with the $p$-type conductivity of the substrate 20, it is to be understood that the substrate may be equally of the $n$-type with the conductivity type of the layers **22*a* and 22*b* and region 24** reversed from that illustrated.

It will be appreciated that the use of the arrangement as shown in FIG. 4 eliminates the disadvantage that an electrode is difficult to be disposed in ohmic contact with a body of intrinsic semiconductive material as in the arrangement of FIG. 1.

An explanation will now be made as to how an arrangement like that shown in FIG. 4 was produced from a substrate of $n$-type germaniam (Ge) containing antimony (Sb) in an impurity concentration of about $10^{15}$ atoms per cubic centimeter and having a length of 1 to 2 millimeters and a cross sectional area of 200 microns by 200 microns. Antimony (Sb) was diffused into the substrate from both ends to form a pair of opposite $n^+$-type layers 22 having a depth of 20 microns and a surface concentration of about $10^{19}$ Sb atoms per cubic centimeter. Then indium (In) was alloyed with one of the $n^+$-layers by known alloying technique to simultaneously form a $p^+$-type region and an electrode such as shown at 24 and 36 in FIG. 4. A pair of electrodes corresponding to the 26 and 28 shown in FIG. 4 then were attached to the $n^+$-type layers in a conventional manner and similarly another electrode was disposed on the $p^+$-type region and maintained positive with respect to the adjacent electrode.

With the substrate having a length of 1 millimeter, the application of a voltage exceeding 300 volts across the electrodes on the $n^+$-type layer caused the device to oscillate with the electrode 28 kept positive with respect to the electrode 26. Also with a 2 mm. long substrate, an oscillation was caused with a voltage exceeding 600 volts. In both cases, the 300 and 600 volts are the threshold voltage. It was observed that a bias current in the order of 0.3 ampere flowed through the electrode 30 in both cases. A probe was used to measure potentials in the operating zone. It was thereby observed that moving domains exist as a result of the negative resistance effect of bulk devices. Upon practicing the present invention, it is not required to use a particular crystal orientation.

In the arrangement of FIG. 4, a voltage should be applied across the terminals 32 and 34 with such a polarity that the electrons injected from the left-hand end, as viewed in FIG. 4, into the region 20 drift through the region 20. Therefore, the terminal 32 is positive with respect to the terminal 34.

From the foregoing it will be appreciated that the invention has provided fully novel semiconductor negative resistance devices wherein the number of the carriers involved decreases with the strength of an electric field applied. Further, it is to be noted that the invention is applicable to inexpensive semiconductive materials such as silicon with satisfactory results.

It is generally known that in bulk negative resistance devices the high electric field layer is locally formed as evidenced by the Gunn effect and can be moved to cause an oscillation. It has been found that the present devices effect similarly the oscillation.

In order to determine the degree to which the electron density and therefore the current density depends upon the applied electric field, it is necessary to calculate the factor $C(F)$ (see Equations (8) and (9)). In the calculation of $C(F)$ it is assumed that (1) the electrons follow the Boltzmann distribution, and (2) the electron distribution in the valley II is governed by that in the valley I. The assumption (2) is based upon the consideration that the valley I is higher in state density than the valley II although the electrons in one of the valleys are different from those in the other valley in electron temperature and therefore in electron distribution because the valleys are different in effective mass from each other.

Under these assumed conditions, the numbers $n_1$ and $n_2$ of electrons in the valleys I and II are expressed by the following equations:

$$n_1=\int_0^\infty Z_1(E)f(E)dE \qquad (11)$$

and $$n_2=\int_0^\infty Z_2(E)f(E+\Delta E)DE \qquad (12)$$

where $E$ is energy level contained in one valley and $\Delta E$ is an energy difference between the valley I and the valley II. Further $L_1(E)$ and $Z_2(E)$ represent the respective state densities of the valleys I and II expressed by $$Zi(E) \propto (2m^*_i)^{3/2}E^{1/2},\ i=1,\ 2 \qquad (13)$$

where $m_i^*$ is the effective mass of electron. $f(E)$ represents the distribution function expressed by $$f(E)=A\exp\left(-\frac{E}{kT_e(F)}\right) \qquad (14)$$

where $A$ is a constant, $k$ the Boltzmann's constant and $T_i(F)$ represent an electron temperature in the strength $F$ of electric field.

By using the above Equations (9), (11), (12), (13) and (14), $C(F)$ for germanium is calculated at $$C(F)=4\left\{\frac{(m^*_{11}m^*_{12}m^*_{13})^{1/3}}{m^*_2}\right\}^{3/2}\exp\frac{\Delta E}{kTe(F)} \qquad (15)$$

where $m_2^*$ = effective mass in valley II $m_{11}^*$ = effective mass in a $< 111 >$ direction in the valley I $m_{12}^*$, $m_{13}^*$ = effective mass in two directions orthogonal to the $< 111 >$ direction in the valley I.

The factor of 4 in the righthand side of the equation (15) results from the fact that the valley I is equal to four times the valley II.

The substitution of $E=0.14eV$, $m_{11}^*=0.082$, $m_{12}^*=m_{13}^*=1.64$ and $m_2^*=0.031$ into the Equation (15) yields the equation $$C(F)=8.78\times10^3\exp[0.14/k\mathrm{Te}(F)] \qquad (16)$$

From the Equation (16) it is seen that the determination of $C(F)$ requires the calculation of $Te(F)$, $Te(F)$ has been determined on the basis of Yamashita and Inoue theory disclosed in "Journal of Physics and Chemistry of Solids," Vol. 12 (1959) p. 1.

In this way ($C(F)$ has been determined and by using the Equation (8), $n(F)/n_0$ has been calculated. Further, $J(F)$ $J(F)/qn_0\mu_0$ has been determined from the above cited theory and the Equation $J(F)=qn(F)V_d(F)$ where $q$ = charge on electron or hole $n(F)$ = electron density in applied electric field $F$ and $V_d(F)$ = drift velocity in electric field $F$.

Then the electron and current densities were calculated with the parameter $\tau_{01}/\tau_{20}$ having values of $10^4$, $10^5$ and $10^6$ respectively and their results are illustrated in FIGS. 5 and 6 wherein the axis of abscissas represents the electric field $F$ in volts per centimeter and the axis of ordinates represents a value of electron density in electric field relative to that in null field for FIG. 5 while it represents a ratio of current density $J(F)$ in the electric field $F$ to electron conductivity $gn_0\mu_0$ in null electric field in terms of volts per centimeter for FIG. 6. In FIG. 6, the curve labelled "38" indicates a simple bulk of $n$-type germanium and exhibits no negative resistance characteristic, while the remaining three curves clearly exhibit the negative resistance characteristic.

FIG. 7 illustrates one experiment by which the concept of the invention is verified. In FIG. 7, an elongated N-type semiconductor body 40 of rectangular cross section was formed with the dimensions of 3 × 0.3 × 0.2 mm. of germanium (Ge) doped with antimony (Sb) to a resistivity of about 20 ohms-cm. The body 40 is provided on the opposite faces of one end portion with contacts 42 and 46 and on opposite faces of the opposite end portion with contacts 44 and 50 in the form of rectangles 0.5 mm long and 0.2 wide. The contact 42 is disposed in ohmic contact with the upper face of the right-hand end portion, as viewed in FIG. 7 of the body 40 by alloying a gold-antimony (Au-Sb) alloy on that face. Similarly the contact 44 is disposed in ohmic contact with the lower face of the left-hand end portion, as viewed in FIG. 7 of the bulk 40. On the other hand, the contacts 46 and 50 opposite to the contacts 42 and 44 respectively are made of indium (In) by alloying technique and therefore formed PN junctions 48 and 52 between the same and the semiconductor body 40 respectively. Therefore the body 40 has an effective length of 2 mm. between the opposite edges of the contacts 42 and 50 or 44 and 46.

As shown in FIG. 7, a variable source of voltage 54 is connected across the contacts 44 and 50 to forwardly bias the PN junction 52 to a desired extent with the contact 44 connected to ground. Thus the voltage across the source 54 can vary to control the number of carriers, in this case holes, injected into the semiconductor body 40. Also, a variable source of voltage 56 is connected across the contacts 42 and 46 to reversely bias the PN junction 48 in order that the PN junction 48 serves to collect the carriers injected into the body 40 through the PN junction 52.

The arrangement as above described was used to measure the negative resistance of the semiconductor body 40 with the voltage across the source 54 varied between 0 and about 1.1 volts and with the voltage across the source 56 kept in the order of 10 volts. The resistance was measured between terminals 58 and 60.

The results of the measurement is illustrated in FIG. 8 wherein the axis of abscissas represents a mean acceleration field intensity $E$ in volts per centimeter and the axis of ordinates represents the total current I in milliamperes flowing through the body 40 between the ohmic contacts 42 and 44. The mean acceleration field intensity has an absolute magnitude of the acceleration voltage 62 divided by the distance of 2 mm. between the contacts 42 and 50.

In FIG. 8, curve *a* illustrates the case in which a current flows only between the contacts 44 and 42 while both sources 54 and 56 are maintained at zero voltage. Curves *b* and *c* depict the case in which the voltage of the source 54 applied across the contacts 50 and 44 is varied from 0 to 10 volts while the voltage across the source 56 is maintained at 10 volts. In curve *c*, the voltage across the source 54 is higher than in curve *b*. Therefore the number of the injected carriers is higher for curve *c* than for curve *b*. As seen from curve *b*, the current is saturated at a mean acceleration field intensity of about 750 volts/cm. or more. However, curve *c* indicates that a threshold field occurs at a mean acceleration field intensity of 750 volts/cm. The semiconductor bulk has a negative resistance above that threshold field and the current becomes unstable at mean acceleration field intensities of about 1,000 volts/cm. and more. Curve *c* corresponds to the case in which the relationship $n_o \approx p_o$ is held, as described in the present specification. With other specimens, it has been found that the threshold field ranges from 500 to 1,000 volts/cm.

The experiments as above described were repeated with N-type germanium bulks having the resistivity between 5 and 50 ohms-cm. Similarly the negative resistance effect and the instability of the current were observed.

The resulting oscillation frequency is dependent upon the external circuits and the voltage across the bias source 54, that is, the number of the injected carriers. With a bias between 0 and 1.1 volts, the frequency ranged from about 10 kilohertz to 2 megahertz. There was found no interdependence between the electric field and the crystallographic axis of the semiconductor bulk.

For operation of the circuit of FIG. 7 in the oscillation mode, a resonant circuit 64 is connected between the terminals 58 and 60 in parallel with a source 62 for the acceleration voltage. The resonant circuit 64 may, for example, be a series connected or parallel connected LC circuit. The resistance of the semiconductor body can be measured by means of a suitable meter M.

With a semiconductor device in accordance with the present invention, the electron density in the conduction band can be rendered approximately equal to the hole density in the valence band by irradiating the wafer of semiconductor material with light, for example by means of a semiconductor laser 35 as illustrated schematically in FIG. 4 or by an infrared lamp. Moreover, the temperature of the device may be increased by heating the substrate by means of a heater shown by way of example as an electric resistance 21 and source of D.C. current.

It will be understood that the semiconductor device of the present invention can be used in many different applications where a negative resistance is desired.

What I claim and desire to secure by Letters Patent is:

1. A method of imparting a negative resistance to a wafer of semiconductive material having applied thereacross a threshold magnitude of an electric field above which a current flowing through the semiconductive material decreases with an increase in the applied electric field, which method comprises the steps of causing both electrons and holes to exist respectively in the conduction and valence bands of said semiconductive material so as to be approximately equal in density to each other in thermal equilibrium in the absence of the applied electric field, said semiconductive material having an energy band structure in which said semiconductive material includes a first valley and a second valley in the conduction band and a third valley in the valence band, said second valley being higher in energy level than said first valley, a vector of wave number at a minimum point on said second valley being equal to that at a maximum point on said third valley; and establishing an electric field in said semiconductive material.

2. A method of imparting a negative impedance to a wafer of semiconductive material having applied thereacross a threshold magnitude of an electric field above which a current flowing through the semiconductive material decreases with an increase in the applied electric field; which method comprises using, as said semiconductive material, a semiconductive material having both electrons and holes existing respectively in the conduction and valence bands so as to be approximately equal in density to each other in thermal equilibrium in the absence of an applied electric field, and which includes a first valley and a second valley in the conduction band and a third valley in the valence band, said second valley being higher in energy level than said first valley, a vector of wave number at a minimum point on said second valley being equal to that at a maximum point on the valence valley; and establishing an electric field in said semiconductor material.

3. A method as claimed in claim 1 wherein said wafer of semiconductive material is put in the oscillation mode of operation.

4. A method as claimed in claim 2 wherein said wafer of semiconductive material is put in the oscillation mode of operation.

5. A method as claimed in claim 1 wherein said semiconductive material is one selected from the group consisting of germanium (Ge), silicon (Si), gallium phosphide (GaP) and gallium aluminum arsenide ($[GA_{1-x}Al_x]As$) where $x$ has a value of about 0.5.

6. A method as claimed in claim 2 wherein said semiconductive material is one selected from the group consisting of germanium (Ge), silicon (Si), gallium phosphide (GaP) and gallium aluminum arsenide ($[Ga_{1-x}Al]As$) where $x$ has a value of about 0.5.

7. A method as claimed in claim 2 wherein said semiconductive material is intrinsic.

8. A method as claimed in claim 2 wherein said wafer is formed of intrinsic germanium (Ge) and has disposed at both ends thereof a pair of electrodes across which said electric field is applied.

9. A method as claimed in claim 1 wherein said semiconductive material has a selected one of the P- and N-conductivity types.

10. A method as claimed in claim 1 wherein said semiconductive material has a selected one of the P- and N-conductivity types and wherein the electron density in the conduction band is rendered approximately equal to the hole density in the valence band by irradiating said wafer of semiconductive material with light.

11. A method as claimed in claim 1 wherein said semiconductive material has a selected one of the P- and N-conductivity types and wherein the electron density in the conduction band is rendered approximately equal to the hole density in the valence band by increasing the temperature of said wafer of semiconductive material.

12. A method as claimed in claim 1 wherein said wafer includes an active region of one type conductivity and a carrier injection region of opposite type conductivity disposed on one end face of said wafer to define a PN junction with said active region, and wherein said PN junction is forwardly biased by injecting the minority carrier from said injection region into said active region thereby to render the electron density in the conduction band approximately equal to the hole density in the valence band.

13. A method as claimed in claim 1 wherein said wafer of semiconductive material includes an active region of one type conductivity, a highly doped region of the one type conductivity higher in impurity concentration than said active region and disposed on each of the opposite faces of said wafer, and a carrier injection region of opposite type conductivity disposed on one of said pair of highly doped regions and one electrode attached to each of said highly doped regions and injection region.

14. A semiconductor negative resistance device comprising a wafer of semiconductive material having an energy band structure in which said semiconductive material includes a first valley and a second valley in the conduction band and a third valley in the valence band, said second valley being higher in energy level than said first valley, and a vector of wave number at a minimum point on said second valley is equal to that at a maximum point on said valence valley; means for causing both electrons and holes to exist respectively in the conduction and valence bands of said semiconductive material so as to be approximately equal in density to each other in thermal equilibrium in the absence of an electric field applied thereacross; and means for establishing an electric field in said semiconductive material.

15. A semiconductor negative resistance device comprising a wafer of semiconductive material having both electrons and holes existing respectively in the conduction and valence bands so as to be approximately equal in density to each other in thermal equilibrium in the absence of an electric field applied thereacross and having an energy band structure in which said semiconductive material includes a first valley and a second valley in the conduction band and a third valley in the valence band, said second valley being higher in energy level than said first valley and a vector of wave number at a minimum point on the second valley being equal to that at a maximum point on the valence band; and means for establishing an electric field in said semiconductive material.

16. A semiconductor negative resistance device a claimed in claim 14 wherein said semiconductive material is one selected from the group consisting of germanium (Ge), silicon (Si), gallium phosphide (GaP) and gallium aluminum arsenide ($[Ga_{1-x}Al_x]As$) where $x$ has a value of about 0.5.

17. A semiconductor negative resistance device as claimed in claim 15 wherein said semiconductor material is one selected from the group consisting of germanium (Ge), silicon (Si), gallium phosphide (GaP) and gallium aluminum arsenide ($[Ga_{1-x}Al_x]As$) where $x$ has a value of about 0.5.

18. A semiconductor negative resistance device as claimed in claim 15 wherein said semiconductive material is intrinsic.

19. A semiconductor negative resistance device as claimed in claim 15 wherein said wafer is formed of an intrinsic semiconductor germanium, and said means for establishing the electric field comprises electrodes attached to the opposite faces of said wafer.

20. A semiconductor negative resistance device as claimed in claim 14 wherein said semiconductive material has a selected one of the P- and N-conductivity types, and said means for rendering the electron density in the conduction band approximately equal to the hole density in the valence band comprises means for electrically injecting the minority carriers into said semiconductive material.

21. A semiconductor negative resistance device as claimed in claim 14 wherein said semiconductive material has a selected one of the P- and N-type conductivity types, and said means for rendering the electron density in the conduction band approximately equal to the hole density in the valence band comprises means for irradiating said wafer of semiconductive material with light.

22. A semiconductor negative resistance device as claimed in claim 14 wherein said semiconductive material has a selected on of the P- and N-conductivity types, and said means for rendering the electron density in the conduction band approximately equal to the hole density with the valence band comprises means for increasing the temperature of said wafer of semiconductive material.

23. A semiconductor material resistance device as claimed in claim 14 wherein said wafer includes an active region of one type conductivity and a carrier injection region of opposite type conductivity disposed on one end face of said wafer to define a PN junction with said active region, and means are provided for forwardly biasing said PN junction to inject the minority carrier from said injection region into said active region thereby to render the electron density in the conduction band approximately equal to the hole density in the valence band.

24. A semiconductor negative resistance device as claimed in claim 14 wherein said wafer includes an active region of one type conductivity and a carrier injection region of opposite type conductivity disposed on one end face of said wafer to define a PN junction with said active region, and a pair of electrodes is disposed on said carrier injection region and on that portion adjacent the latter region of said active region respectively to forwardly bias said PN junction to inject the minority carrier from said injection region into said active region thereby to render the electron density in the conduction band approximately equal to the hole density in the valence band.

25. A semiconductor negative resistance device as claimed in claim 15 wherein said wafer of semiconductive material includes an active region of one type of conductivity, a highly doped region of the one type conductivity higher in impurity concentration than said active region and disposed on each of the opposite faces of said wafer, and a carrier injection region of opposite type of conductivity disposed on one of said pair of highly doped regions, and an electrode attached to each of said highly doped regions and injection region.

* * * * *